(12) United States Patent
Franca-Neto

(10) Patent No.: US 7,151,810 B2
(45) Date of Patent: Dec. 19, 2006

(54) DATA AND CLOCK SYNCHRONIZATION IN MULTI-CHANNEL COMMUNICATIONS

(75) Inventor: Luiz M. Franca-Neto, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 920 days.

(21) Appl. No.: 10/133,227

(22) Filed: Apr. 26, 2002

(65) Prior Publication Data

US 2003/0210755 A1 Nov. 13, 2003

(51) Int. Cl.
*H04L 7/00* (2006.01)

(52) U.S. Cl. ...................................... 375/355

(58) Field of Classification Search ................ 375/371, 375/373, 376, 355; 327/115, 117
See application file for complete search history.

(56) References Cited

U.S. PATENT DOCUMENTS

| | | | |
|---|---|---|---|
| 4,466,106 A * | 8/1984 | Serrano ....................... | 375/223 |
| 5,172,400 A * | 12/1992 | Maemura ..................... | 377/116 |
| 5,379,002 A | 1/1995 | Jokura | |
| 5,550,860 A | 8/1996 | Georgiou et al. | |
| 6,239,634 B1 | 5/2001 | McDonagh | |
| 6,281,726 B1 | 8/2001 | Miller, Jr. | |
| 6,281,728 B1 | 8/2001 | Sung | |
| 6,289,068 B1 | 9/2001 | Hassoun et al. | |
| 6,326,826 B1 | 12/2001 | Lee et al. | |
| 6,337,590 B1 | 1/2002 | Millar | |
| 6,441,667 B1 | 8/2002 | Boerstler et al. | |
| 6,452,431 B1 | 9/2002 | Waldrop | |
| 6,504,408 B1 | 1/2003 | Von Kaenel | |
| 2001/0036240 A1 * | 11/2001 | Gossmann et al. ......... | 375/376 |

* cited by examiner

*Primary Examiner*—Kevin Kim
(74) *Attorney, Agent, or Firm*—Fish & Richardson P.C.

(57) ABSTRACT

A clock signal is generated by receiving an input clock signal having an input clock signal frequency, dividing the input clock signal frequency by a selected number to produce a lower frequency output clock signal, and shifting the phase of the output clock signal. The phase can be shifted by changing, for at least a predetermined amount of time, the selected number by which the input clock signal frequency is divided, and then restoring the selected number to its original value. The clock can be used as a channel sampling clock, and it can be synchronized to the data by the phase shifting. One implementation uses a chain of flip-flops for dividing the frequency and additional circuitry for shifting phase. The flip-flops may be connected with minimum logic in order to operate at substantially the highest frequency reachable by a given transistor technology.

27 Claims, 8 Drawing Sheets

400

DATA AND CLOCK SYNCHRONIZATION IN MULTI-CHANNEL COMMUNICATIONS

TECHNICAL FIELD

Aspects of this invention relate to communications systems generally, and more particularly to generating a channel sampling clock and optimally synchronizing that clock with the channel data in a multi-gigabit/second multi-channel communication system.

BACKGROUND

Multi-channel communication techniques are used, for example, to overcome notches in the transfer function of a communication system. Such notches effectively act as either low-pass or no-pass filters at various frequencies. The use of multiple channels allows designers to avoid these notches. In a multi-channel communication system, data is put on each of the channels separately and the channels are multiplexed into a single signal. At the receiver, the multiple channels are demultiplexed. The signal in each channel is brought down to baseband and the data are extracted. Extracting the data for a given channel entails generating a sampling signal at an appropriate frequency and aligning the sampling signal with the data for the given channel.

Performing these operations in a hard-wired digital design becomes more difficult as the data rate on each channel increases. Also, performing these operations with a standard digital signal processing ("DSP") core, or with a processor machine operating on an accumulator-architecture, may limit the achievable data rate for a given integrated circuit technology process.

DETAILED DESCRIPTION

Figure 1:
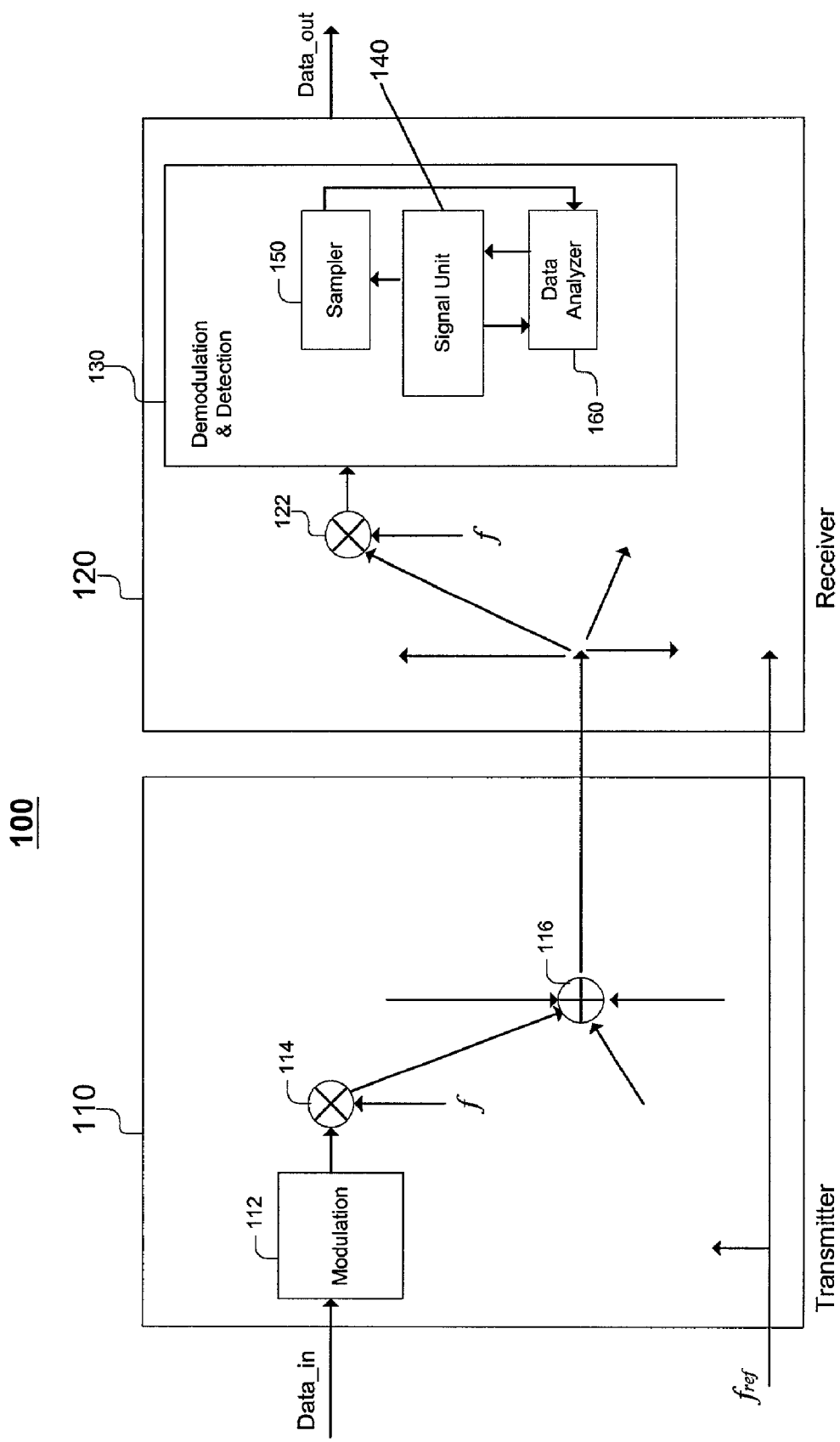
FIG. 1 is a block diagram of a multi-channel communication system.

FIG. 1 depicts a multi-channel communication system 100, that may include a transmitter 110 and a receiver 120. Transmitter 110 may include a modulator 112 that modulates an incoming data line, an up-converter 114 that puts the modulated data on a carrier, and an adder 116 that is capable of adding multiple, modulated, up-converted data lines to form a transmitted data signal that is received by receiver 120.

Transmitter 110 may use a reference clock, $f_{ref}$, in the process of forming the transmitted data signal. In one implementation, $f_{ref}$ is the maximum frequency available in the technology used. Other implementations may use different clock speeds when warranted by a particular application. One implementation uses a reference clock having a frequency corresponding to the maximum data rate of the multi-channel system.

Receiver 120 may also either receive or generate the reference clock $f_{ref}$. Receiver 120 may receive the data signal, distribute the data signal, convert the channels to baseband, and extract the data. This process is shown in FIG. 1 for a single channel that is selected by the frequency "f," of, for example, a local oscillator signal, used at a down-converting mixer 122. The baseband signal is demodulated using a demodulator 130.

Within the demodulator 130, a signal unit 140 may generate a sampling signal that can be used to sample the incoming data stream in a sampler 150. The resulting digital output data may be analyzed in a data analyzer 160 to determine the quality of the output data. One technique for determining the quality is to transmit a known sequence of data and correlate the output data with this known sequence.

Figure 2:
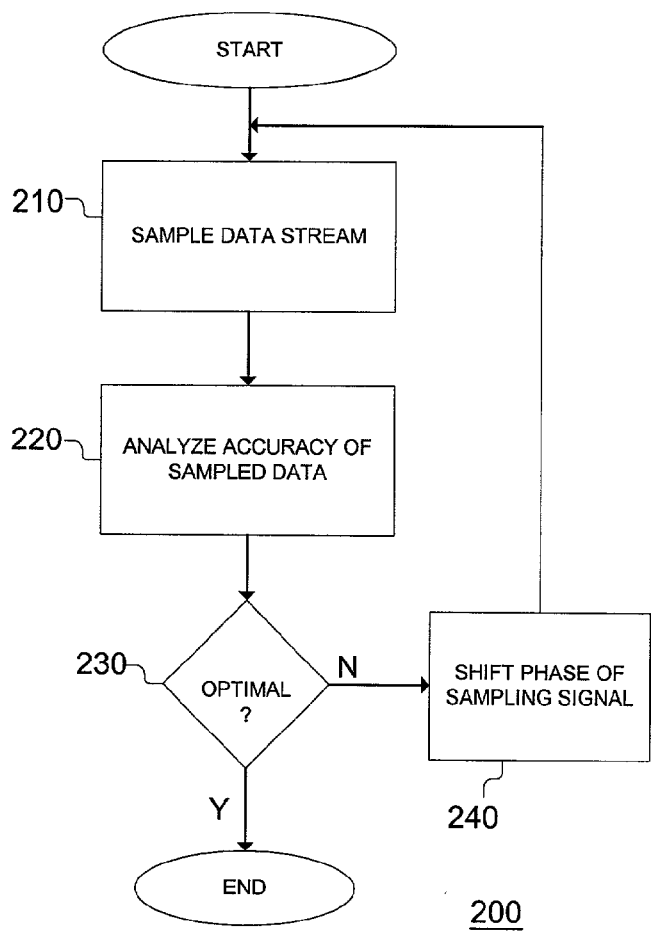
FIG. 2 is a flow chart of a process for determining if alignment is optimal.

FIG. 2 shows a flow chart 200 of one implementation for determining if the sampling signal is optimally aligned with the incoming data. An iterative process is begun in which: (1) the incoming data stream is sampled (210); (2) the resulting output data are analyzed to determine accuracy (220); (3) the accuracy is checked to see if the alignment is optimal (230); and (4) if the alignment is not optimal, the signal unit 140 shifts the phase of the sampling signal (240) and the process is repeated until an optimal phase shift is determined. In one implementation, optimality is determined by selecting the phase shift that results in the highest correlation between transmitted and received data. In that implementation, the process may iterate through all possible values of phase shift or may use a procedure to determine an operating point without testing all possibilities. As the phase shift increment is made smaller, the iterative process may be able to find a more optimal operating point. Another implementation uses a threshold accuracy value and declares as optimal the first value of phase shift that results in an accuracy meeting the threshold.

Figure 3:
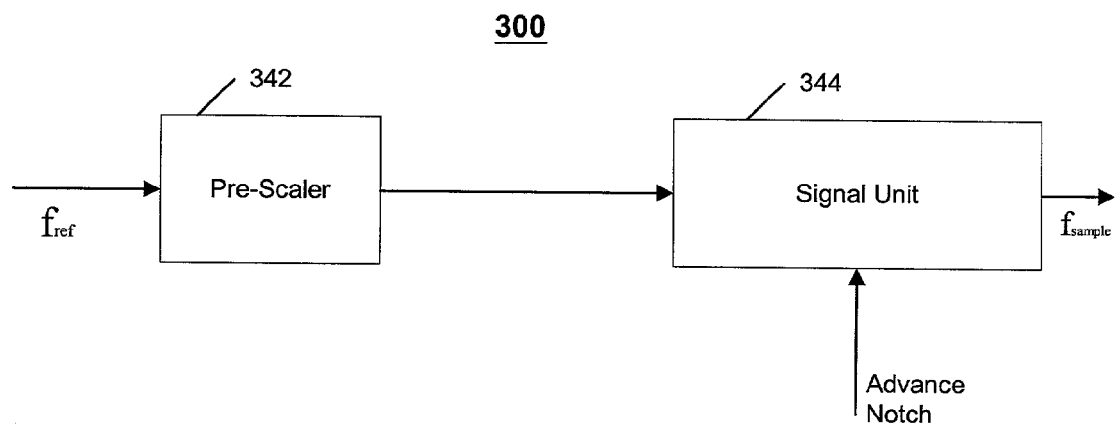
FIG. 3 is a block diagram of a system for generating and shifting a sampling signal.

FIG. 3 illustrates a system 300 that may be used as a particular implementation of signal unit 140. In the system 300, the reference clock, $f_{ref}$, enters an optional prescaler 342 that divides the clock by an amount that may be predetermined or dynamically-configurable. The divided clock then enters a signal unit 344 that divides the clock frequency down to the sampling frequency and selectively shifts the phase of the resulting sampling clock, $f_{sample}$. The signal unit 344 shifts the phase in response to receiving an active advance notch signal 346. An advance notch signal refers to a signal that indicates that the phase of the sampling clock is to be shifted. The direction and size of the shift may vary with implementations, as may the timing and other characteristics of the advance notch signal.

Figure 4:
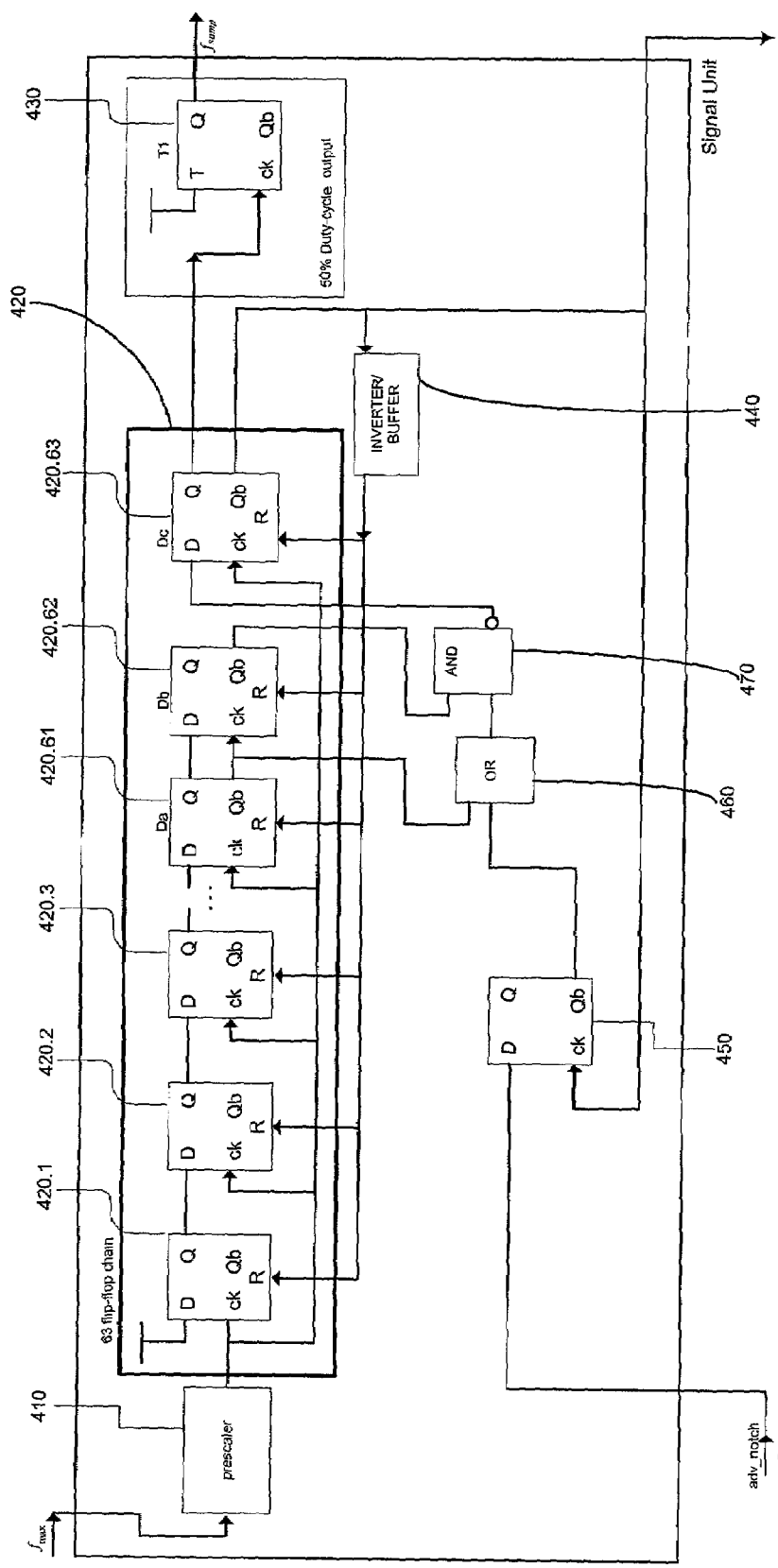
FIGS. 4–6 are high-level circuit diagrams of systems for generating and shifting a sampling signal.

FIG. 4 illustrates a control unit 400 that may be used as an implementation of signal unit 140. The control unit 400 may include a prescaler 410 that corresponds to the prescaler 342 of the system 300 of FIG. 3. The remainder of the control unit 400 corresponds generally to the signal unit 344 of the system 300 of FIG. 3.

In this disclosure, when component A and component B are said to be "coupled," there may be one or more other components, components C and D for example, disposed between components A and B. In this disclosure, when flip-flop A and flip-flop B are said to be "connected in series," then at least one of the outputs (for example, the non-inverted output or the inverted output) of one of the flip-flops (for example, flip-flop A) is connected to at least one of the inputs (for example, the data input, the clock input, or the reset input) of the other flip-flop (for example, flip-flop B) without any intervening logic.

The control unit 400 may include a flip-flop chain 420 coupled to the prescaler 410 and including 63 D flip-flops 420.1–420.63. The output of the prescaler 410 clocks each of the flip-flops 420.1–420.63 in the chain 420. The data input 20 of the first flip-flop 420.1 in the chain 420 is tied to the supply voltage and the data inputs of the next 61 flip-flops 420.2–420.62 are tied to the output of the preceding flip-flop in the chain 420. The data input of the last flip-flop 420.63 in the chain 420 is tied to the output of combinatorial logic that processes, in part, the inverted outputs of the two preceding flip-flops 420.61, 420.62.

The output of the last flip-flop 420.63 in the chain 420 clocks a T flip-flop 430. The data input of the T flip-flop 430 is tied to the supply voltage and the output provides the sampling clock $f_{samp}$. The inverted output of the last flip-flop 420.63 of the chain 420 drives an inverter/buffer 440, the output of which supplies a reset signal to each of the flip-flops 420.1–420.63 in the chain 420.

The combinatorial logic that supplies the data input of the flip-flop 420.63 includes a D flip-flop 450, an OR gate 460, and a NAND gate 470. An advance notch signal 446, analogous to the advance notch signal 346 in FIG. 3, is coupled to the data input of the flip-flop 450. The inverted output of the flip-flip 450 and the inverted output of the flip-flop 420.61 are the inputs to the OR gate 460. The output of the OR gate 460 and the inverted output of the flip-flop 420.62 are the inputs to the NAND gate 470. The output of the NAND gate 470 is coupled to the data input of the last flip-flop 420.63 in the chain 420.

The control unit 400 is designed to be used in a system with 128 channels operating at the same data rate and a reference frequency that is 128 times that of the data rate on each channel. Accordingly, the reference frequency must be divided by 128 to yield the sampling signal, $f_{samp}$, that is output by the control unit 400. Other implementations need not operate each channel at the same data rate.

In addition, the prescaler 410 need not be used. When used, the prescaler 410 may, for example, enable the use of a clock signal, $f_{max}$, having a frequency above the frequency at which a D flip-flop chain can operate. The prescaler 410 may be used to produce, for example, a division by two in the frequency of $f_{max}$ using analog methods.

The operation of the chain 420 of flip-flops 420.1–420.63 is now described. Each of the D flip-flops 420.1–420.63 delays the reference clock by one period of the reference clock. This is accomplished by initially resetting all of the D flip-flops 420.1–420.63 so that the output of each D flip-flop is zero, and then propagating "one" through the chain, with the propagation progressing at the rate of one flip-flop per period of the reference clock. The "one" propagates to the output of the last D flip-flop 420.63 after 63 periods, at which time the "one" clocks the T flip-flop 430 and initiates a reset of the entire chain of D flip-flops 420 to restart the process.

In this implementation, the reset at each D flip-flop 420.1–420.63 is presumed to be clocked, thus providing one period of reset in addition to the 63 periods in which the "one" is propagated. Thus, every 64 reference-clock periods, the T flip-flop 430 is clocked and its output is inverted. If an unclocked, or asynchronous, reset is used, then 64 D flip-flops are used. The output of the T flip-flop 430 completes one cycle after it is clocked twice. This occurs after 128 periods of the reference clock, thus dividing the reference frequency by 128. The output of the T flip-flop 430 provides a clock having a 50% duty cycle.

The implementation of FIG. 4 uses a chain 420 of flip-flops 420.1–420.63 to increase the speed of the circuit. As shown in FIG. 4, the connections between the flip-flops 420.1–420.63 are direct and the logic is not complicated, thus increasing speed when implemented as an integrated circuit. One implementation employs 180 nanometer ("nm") technology in a complementary metal oxide semiconductor ("CMOS"). The direct connection between the output and input of the flip-flops 420.1–420.63 may enable the highest operating frequency for a frequency divider using digital methods. This implementation can also take advantage of the functional block repetition of the chain 420 for simplified realization in an integrated circuit. The fast speeds enabled by the implementation of FIG. 4 allow high data rates on each channel, which allows a given total data rate to be achieved using a small number of channels. Fewer channels results in a simpler, less expensive, more robust design. One implementation allows data rates of at least one gigabit/second on each channel. Alternate implementations could use counters and other known techniques, instead of a chain of flip-flops, to divide the reference clock. However, such alternate implementations may be unable to attain as high an operating frequency as the disclosed flip-flop chains.

Figure 5:
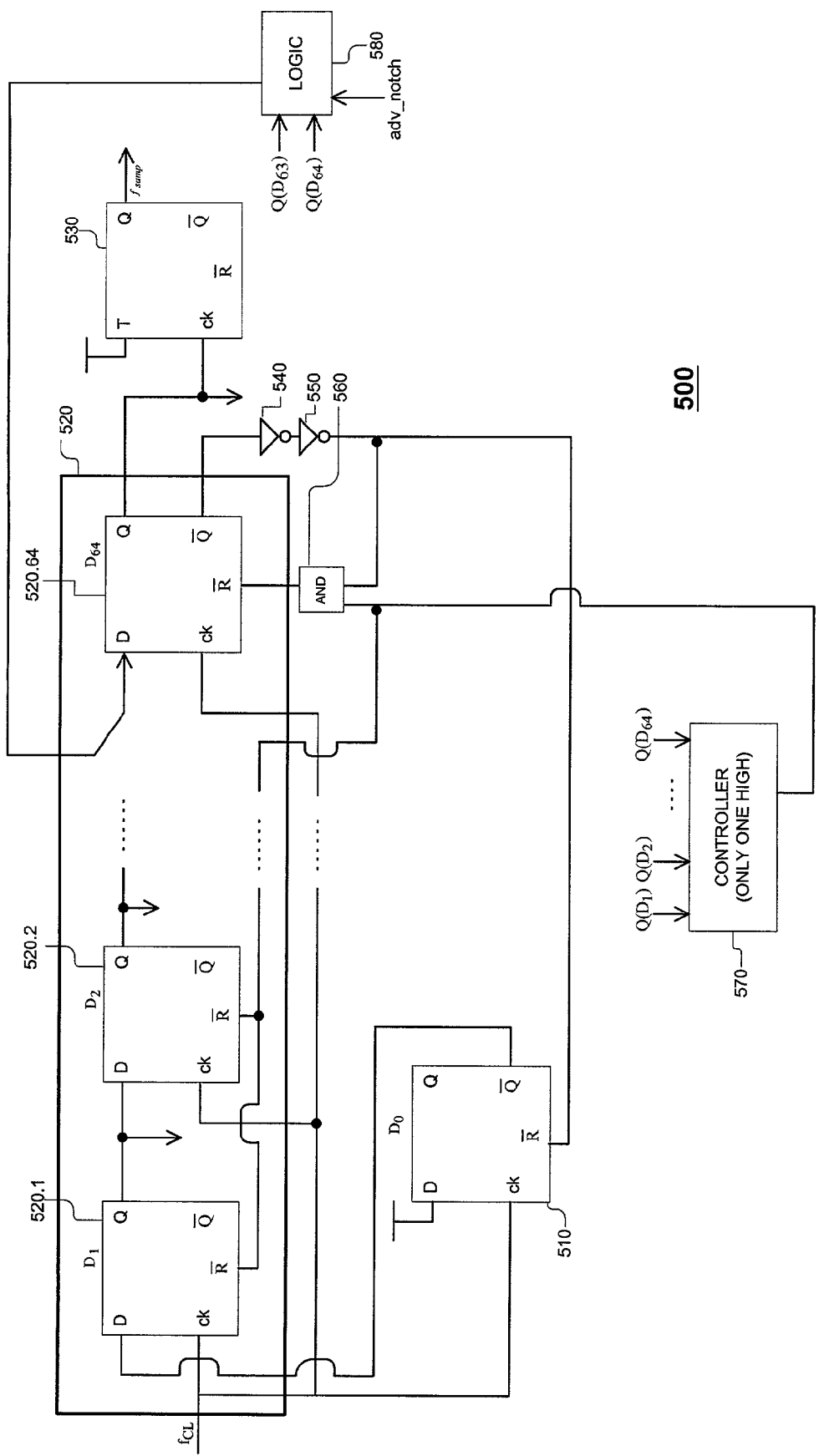

FIG. 5 depicts another system 500 for generating a sampling signal. The system 500 may include a chain 520 of 64 D flip-flops 520.1–520.64 (also denoted $D_1$–$D_{64}$), which is analogous to the chain 420 in the control unit 400 of FIG. 4.

The data input of the first flip-flop 520.1 in the chain 520 is coupled to the inverted output of a D flip-flop 510, the data input of which is tied to the supply voltage. The flip-flop 510 and the flip-flops 520.1–520.64 in the chain 520 are clocked by $f_{CL}$, which is analogous to $f_{max}$ in FIG. 4.

The interconnections between the flip-flops 520.1–520.64 are also analogous to those in the control unit 400 of FIG. 4. The output of each of the first 62 flip-flops 520.1–520.62 in the chain 520 is coupled to the data input of the next flip-flop in the chain 520. The data input of the last flip-flop 520.64 is coupled to the output of the combinatorial logic 580. The combinatorial logic 580 receives, in a manner analogous to the control unit 400 of FIG. 4, the outputs of the preceding two flip-flops 520.62, 520.63 in the chain 520 and an advance notch signal.

The output of the last flip-flop 520.64 in the chain 520 clocks a T flip-flop 530, which is analogous to the T flip-flop 430 in FIG. 4. The data input of the T flip-flop 530 is tied to the supply voltage and the output is the sampling clock $f_{samp}$.

The inverted output of the last flip-flop 520.64 in the chain 520 is coupled to a series of inverters 540, 550. The output of the second inverter 550 drives a reset input of the flip-flop 510 and one input of an AND gate 560. The output of the AND gate 560 provides a reset signal to the last flip-flop 520.64 in the chain 520.

The other input to the AND gate 560 comes from the output of a controller 570. As FIG. 5 indicates, the controller 570 receives as input the output of each of the flip-flops 520.1–520.64 in the chain 520 and produces a low signal when more than one of these inputs is high.

The operation of the system 500 of FIG. 5 is now described. As indicated above, resetting the flip-flop chain 420 in the implementation of FIG. 4 reinitiates the process of propagating a one down the chain 420. In the implementation of FIG. 4, the reset is triggered off of the last D flip-flop 420.63. The system 500 in FIG. 5 uses a different mechanism to reinitiate the process of propagating a one down the flip-flop chain 520.

In particular, when all of the D flip-flops have been reset, including the chain of 64 D flip-flops 520.1–520.64 and the flip-flop 510, then the inverted output of the flip-flop 510, which is supplied to the data input of flip-flop $D_1$ 520.1, is one. At the next clock signal, this one begins to propagate down the chain 520 of flip-flops. At that same clock signal, the inverted output of flip-flop 510 becomes a zero, and, at the next clock signal, this zero begins to propagate down the chain 520 of flip-flops. Thus, the outputs of the chain 520 of 64 flip-flops will only be "one" for a single reference-clock cycle.

When the propagating one reaches the output of the flip-flop 520.64, it is short-lived because it triggers a reset of that flip-flop 520.64. The two inverters 540, 550 provide a delay so that the output of flip-flop 520.64 is high long enough to trigger the T flip-flop 530. The flip-flop 510 is also reset, and a one again begins propagating down the chain 520 of 64 D flip-flops 520.1–520.64 at the next reference clock.

During normal operation, the system 500 in FIG. 5 does not reset any of the first 63 D flip-flops 520.1–520.63 in the chain 520. In contrast, the implementation 400 of FIG. 4 resets each of the D flip-flops 420.1–420.63 in the chain 420 each time the one propagates through the chain 420. This resetting, in FIG. 4, requires a certain amount of time to allow the reset signal to propagate, particularly if buffers are needed to control fan-out. The time required in FIG. 4 to reset the chain 420 of D flip-flops 420.1–420.63 may limit the maximum speed of the implementation 400 of FIG. 4. The system 500 in FIG. 5, in contrast, does not have the same constraint.

In the system 500, the controller 570 resets the entire chain 520 of 64 D flip-flops 520.1–520.64 whenever there is more than one output that is high. In such a situation, the controller 570 outputs a zero, resetting the first 63 D flip-flops in the chain 520 and causing the output of the AND gate 560 to go low which resets the last D flip-flop 520.64 in the chain 520. This provides a management mechanism to reset and re-start the system 500 in the proper state and it increases robustness by providing a reset whenever a glitch causes the output of one of the 64 D flip-flops 520.1–520.64 to go high. The controller 570 can be implemented in combinatorial logic, or in other well-known ways.

Robustness can be further increased by adding to the output of the controller 570 a D flip-flop (not shown) clocked by the inverse of $f_{CL}$ to provide a delayed clock signal to the D flip-flop. Introducing that D flip-flop, and delaying its clock, prevents the controller 570 from mistakenly going active-low if two adjacent D flip-flops momentarily both have outputs of one as the "one" propagates through them.

Figure 6:
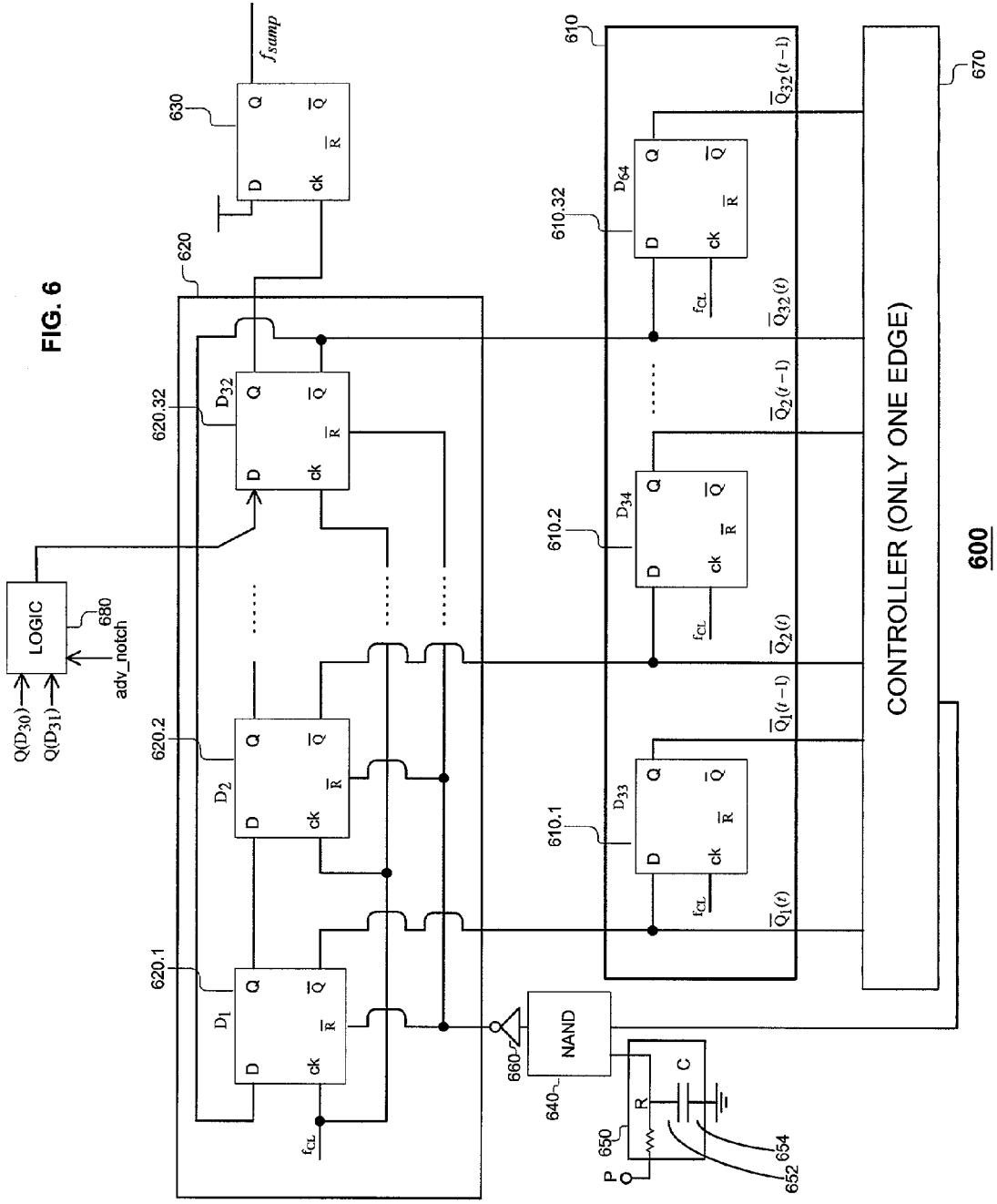

FIG. 6 depicts another system 600 for generating a sampling signal. The system 600 may include a chain 620 of 32 D flip-flops 620.1–620.32 (also denoted $D_1$–$D_{32}$). The chain 620 is analogous to the chain 420 in the control unit 400 of FIG. 4 and the chain 520 in the system 500 of FIG. 5.

Each of the flip-flops 620.1–620.32 in the chain 620 is clocked by $f_{CL}$, which is analogous to $f_{CL}$ in FIG. 5 and $f_{max}$ in FIG. 4. The data input of the first flip-flop 620.1 in the chain 620 is coupled to the inverted output of the last flip-flop 620.32 in the chain 620. The interconnections between the flip-flops 620.1–620.32 are analogous to those in the system 500 of FIG. 5 and the control unit 400 of FIG. 4. The output of each of the first 30 flip-flops 620.1–620.30 in the chain 620 is coupled to the data input of the next flip-flop in the chain 620. The data input of the last flip-flop 620.32 is coupled to the output of the combinatorial logic 680. The combinatorial logic 680 receives, as in the system 500 of FIG. 5, the outputs of the preceding two flip-flops 620.30, 620.31 in the chain 620 and an advance notch signal.

The output of the last flip-flop 620.32 in the chain 620 clocks a T flip-flop 630, which is analogous to the T flip-flops 430, 530 in FIGS. 4 and 5. The data input of the T flip-flop 630 is tied to the supply voltage and the output is the sampling clock $f_{samp}$.

The inverted output of each of the flip-flops 620.1–620.32 in the chain 620 is coupled to a separate D flip-flop 610.1–610.32 in a bank of flip-flops 610. The outputs of the flip-flops 610.1–610.32 in the bank 610, as well as the outputs of the flip-flops 620.1–620.32 in the chain 620, are coupled to a controller 670.

The controller 670 is analogous to the controller 570 of FIG. 5 in that its output serves as a reset signal. The output of the controller 670 is one input to a NAND gate 640. The other input to the NAND gate 640 comes from a resistor-capacitor ("RC") circuit 650 composed of a resistor 652 and a capacitor 654. The resistor 652 and the capacitor 654 share a node that is coupled to an input of the NAND gate 640. The other node of the resistor 652 is coupled to the supply power, and the other node of the capacitor 654 is coupled to ground. The output of the NAND gate 640 is coupled to an inverter 660, the output of which provides a reset signal to each of the flip-flops 620.1–620.32 in the chain 620.

The operation of the system 600 is now explained. After start-up, as explained below, the output of each of the D flip-flops 620.1–620.32 is zero, and the data input to D flip-flop 620.1 is a one. Thus, at the next clock signal on $f_{CL}$, the chain 620 of 32 D flip-flops 620.1–620.32 begins to propagate a one down the chain 620. When the one reaches the output of flip-flop 620.32, the data input to flip-flop 620.1 becomes a zero and, at the next clock signal, that zero begins to propagate down the chain 620. In this way, the output of D flip-flop 620.32 is a 50% duty cycle signal that clocks the T flip-flop 630.

The output of the T flip-flop 630 produces, as with the control unit 400 in FIG. 4 and the system 500 in FIG. 5, a 50% duty cycle sampling clock having a frequency 128 times lower than that of $f_{CL}$. The system 600, however, differs in that the signal clocking the T flip-flop 630 also has a 50% duty cycle. This provides increased robustness. The system 600, as with the system 500, also avoids resetting the entire chain 620 of D flip-flops 620.1–620.32 at the same time. Indeed, the system 600 never resets the chain 620 of D flip-flops 620.1–620.32 during normal operation.

The chain 620 of D flip-flops 620.1–620.32 is reset, however, when either of two conditions occurs. The first is start-up. As shown, a power source P is connected to the NAND gate 640 through the RC circuit 650. At power-up, the RC circuit 650 introduces a delay while the capacitor 654 charges up, which causes a temporary low input to the NAND gate 640. This causes all of the D flip-flops 620.1–620.32 to reset. The values of R and C can be chosen to achieve the desired delay.

The second reset condition is when the controller 670 detects an error. During normal operation of the chain 620 of flip-flops 620.1–620.32, the output of exactly one flip-flop will change after each clock cycle. The controller 670 receives each of the current inverted outputs of flip-flops 620.1–620.32, where the current clock cycle is denoted with the variable "t." The controller 670 also receives each of the inverted outputs for the previous clock cycle, where the previous clock cycle is denoted with the variable "t−1". For each flip-flop 620.1–620.32, the controller 670 compares the current value to the previous value to determine if the flip-flop has changed values. If more than one flip-flop changes its inverted output at any given time, the controller 670 assumes there is an error. The output of the controller 670 is ordinarily high, and only goes low when an error is detected. In this way, the reset inputs of flip-flops 620.1–620.32 are kept high under normal operating conditions. The controller 670 can be implemented with combinatorial logic, or in other well-known ways. As with the system 500 of FIG. 5, the output of the controller 670 can be clocked by using, for example, a D flip-flop (not shown) clocked by the inverse of $f_{CL}$.

The system 600 uses, in the chain 620 that produces the sampling signal, only half as many D flip-flops as the control unit 400 of FIG. 4 and the system 500 of FIG. 5. For this reason, the system 600 is more efficient, and requires less space to implement. However, when the 32 flip-flops 610.1–610.32 ($D_{33}$–$D_{64}$) are included in the total, the three implementations become similar in complexity and space required. The controllers 570, 670 provide increased robustness to their systems to protect against glitches and other error conditions that can be self-perpetuating, whereas the implementation of FIG. 4 can cure many glitches and other error conditions because it resets every D flip-flop 420.1–420.63 in the chain 420 at regular intervals.

Referring again to FIG. 4, the purpose of the logic that interconnects the last three D flip-flops 420.61–420.63 in the chain 420 of FIG. 4 is to bypass D flip-flop 420.62 when the adv_notch signal is active. To accomplish this in the implementation of FIG. 4, the logic passes the output of flip-flop 420.62 to the data input of flip-flop 420.63 when adv_notch is inactive. In addition, the logic passes the output of flip-flop 420.61 to the data input of flip-flop 420.63 when adv_notch is active. These two aspects can be achieved with the logic shown in FIG. 4, including the lower D flip-flop 450, the OR gate 460, and the NAND gate 470. These three components can be collectively referred to as the phase shifter, and the chain 420 of 63 flip-flops 420.1–420.63 can be referred to as the frequency divider.

Upon reset, if adv_notch is inactive (active high), then the output of the OR gate 460 will be a one and the output of the NAND gate 470 will track the output of flip-flop 420.62. Thus, the first aspect is achieved.

Upon reset, if adv_notch is active, then the output of the OR gate 460 will track the inverted output from flip-flop 420.61, which is a one upon reset, as is the inverted output from flip-flop 420.62. Thus, upon reset, the output of the NAND gate 470 is zero. This prevents, flip-flop 420.63 from triggering the T flip-flop 430. When the propagating one reaches flip-flop 420.61, at the next active edge of the clock the inverted output becomes a zero, the output of the OR gate 460 becomes a zero, and the output of the NAND gate 470 becomes a one. Thus, the data input of flip-flop 420.63 becomes a one, which effectively bypasses flip-flop 420.62. Accordingly, the second aspect is achieved.

Figure 7:
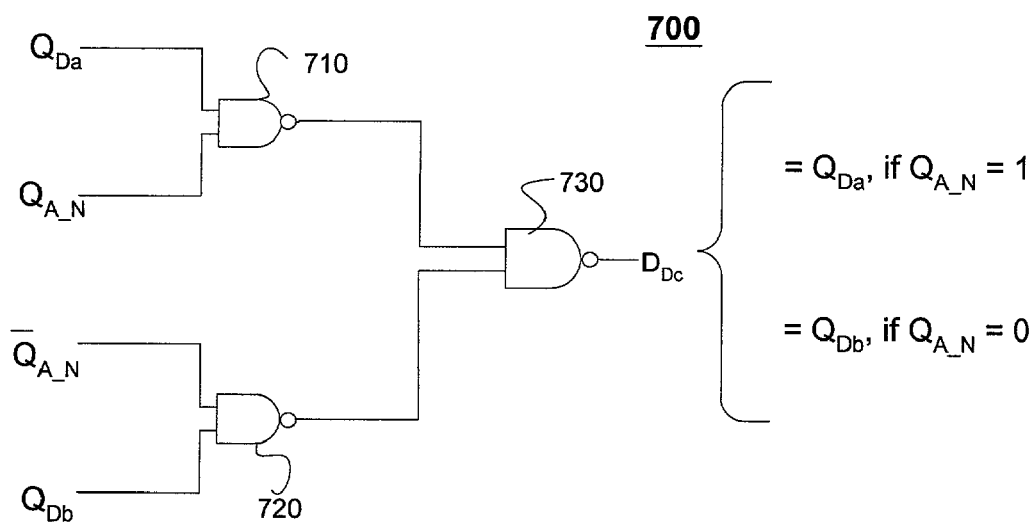
FIG. 7 is a circuit diagram for selecting between two input signals.

This implementation takes advantage of the known states of the D flip-flops. FIG. 7 shows a circuit 700 that is an alternate implementation that works for all values of the inputs in the system 400 of FIG. 4. The circuit 700 may also be used as the combinational logic 580, 680 in FIGS. 5 and 6.

The circuit 700 may include a first NAND gate 710 that receives as input the output of the flip-flop 420.61 ("$Q_{Da}$") and the output of the flip-flop 450 ("$Q_{A\_N}$") from the system of FIG. 4. The circuit 700 may include a second NAND gate 720 that receives as input the output of the flip-flop 420.62 ("$Q_{Db}$") and the inverted output of the flip-flop 450 ("$Q_{A\_N}$ bar") from the system of FIG. 4. The circuit 700 may include a third NAND gate 730 that receives as input the outputs of the first two NAND gates 710, 720. The output of the third NAND gate 730 is coupled to the data input of the flip-flop 420.63 ("$D_{Dc}$") in the system of FIG. 4.

As indicated in the text of FIG. 7, whenever the output of the flip-flop 450 is high, the output of the third NAND gate 730 tracks the output of the flip-flop 420.61. And whenever the output of the flip-flop 450 is low, the output of the third NAND gate 730 tracks the output of the flip-flop 420.62. Thus, the output of the circuit 700 achieves the two aspects discussed above for the flip-flop bypassing logic. The circuit 700 is also amenable to CMOS implementation. One of ordinary skill in the art will recognize that there are numerous other ways of bypassing a flip-flop.

Using logic to bypass a D flip-flop impacts the output sampling clock. In particular, selectively bypassing a D flip-flop has the effect of changing the amount by which the reference frequency is divided. When no flip-flop is bypassed, the reference frequency is divided by a selected number (for example, 128 in the implementation of FIG. 4). When a flip-flop is bypassed, that number is changed. When a D flip-flop is bypassed, it should be seen that the output sampling clock will transition one reference-clock period sooner. If the adv_notch signal, which triggers the bypassing of a D flip-flop, is held active for only one reset signal, then the circuit only bypasses a D flip-flop during one sequence of propagating a one through the chain. The output sampling clock will, therefore, only have one early transition and will thereafter return to its normal frequency. The result, as shown in FIG. 8, is a phase-shifted sampling clock.

Figure 8:
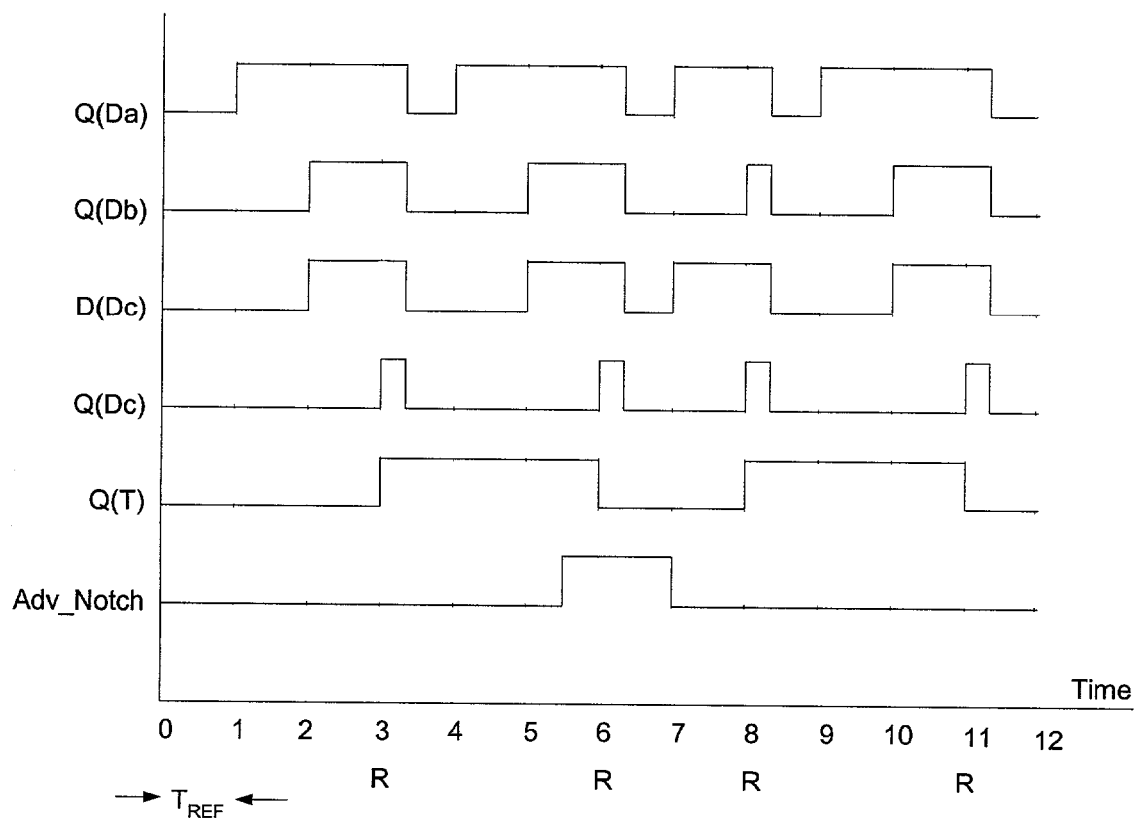
FIG. 8 is a timing diagram illustrating the shifting of a sampling signal.

FIG. 8 is one possible partial timing diagram for an implementation that contains only the last three D flip-flops 420.61–420.63 of the system of FIG. 4, along with the T flip-flop 430 and the flip-flop bypassing logic 450, 460, 470. It is assumed that the data input to flip-flop Da 420.61 is held at a one and that the period of the reference clock is equal to one unit of time. A sampling clock period is described during which the adv_notch signal is inactive, and then a sampling clock period is described during which the adv_notch signal is active.

At time zero, the system is reset. The output of the T flip-flop 430, Q(T), is arbitrary at this point. At time 1, when the next upward transition of the reference clock is received, the output of flip-flop 420.61, Q(Da), rises. At time 2, the output of flip-flop 420.62, Q(Db), rises and is fed to the data input of flip-flop 420.63, D(Dc). At time 3, the output of flip-flop 420.63, Q(Dc), rises and causes the output of the T flip-flop 430 to toggle. The rising output of flip-flop 420.63 also triggers a reset, as indicated by the "R" at time 3 in FIG. 8. It is assumed for FIG. 8 that the reset inputs to the D flip-flops 420.61–420.63 are unclocked. This is indicated by the outputs of the D flip-flops 420.61–420.63 falling after a short propagation delay and before the next reference clock. At times 4, 5, and 6, the pattern from times 1, 2, and 3 is repeated. The reference frequency has been divided by six.

Just prior to time 6, however, the adv_notch signal is brought active. At time 6, when the reset occurs, the adv_notch D flip-flop 450 latches the adv_notch signal. Thus, after time 6, the data input of flip-flop 420.63 tracks the output of flip-flop 420.61, instead of tracking the output of flip-flop 420.62. As a result, at time 8, the outputs of both flip-flops 420.62 and 420.63 become one, causing the output of the T flip-flop 430 to toggle and initiating another reset. As shown in FIG. 8, the period of the output of the T flip-flop 430 has been temporarily shortened for half of its new period.

Because the adv_notch signal was brought inactive shortly after time 6, and before time 8, the reset at time 8 latches an inactive adv_notch signal. Thus, the sequence of events from times 8 through 11 is similar to that between times 0 and 3, and between times 3 and 6. Specifically, the outputs of flip-flops 420.61–420.63 come up in sequence at times 9, 10, and 11, respectively, and the output of the T flip-flop 430 is toggled at time 11. The period of the sampling clock has thus been restored to its original value.

As demonstrated above, the phase is shifted by bypassing a flip-flop for at least a predetermined amount of time. In the implementation of FIG. 4, that amount of time is from the time the output of flip-flop 420.61 goes high until a reset occurs. Alternatively, the predetermined amount of time in the implementation of FIG. 4 may be viewed as lasting (i) only for a single reference-clock period after the output of D flip-flop 420.61 goes high, or (ii) for an entire period between resets if the adv_notch signal 446 is active and latched. If the circuit 700 of FIG. 7 is used, a flip-flop is bypassed during the entire time the active adv_notch signal is latched by the D flip-flop 450.

The effect of bypassing one D flip-flop 420.62 during one sequence through the flip-flop chain 420 is to shift the phase of the sampling clock by one period of the reference clock. The phase shift can be as small as the period of the reference clock.

If the minimum phase-shift increment is not a critical parameter, then it can be increased by using a slower reference clock, or by using the prescaler 410 to divide the clock down. Alternatively, the logic can be modified to allow more than one D flip-flop to be bypassed at a time. Further, the logic may be dynamically configurable to allow the phase increment to be selected by a controlling unit.

The minimum phase-shift increment can also be a scaleable quantity. This would occur, for example, in implementations for which the reference frequency is a function of the number of channels. In one such implementation, shown in FIG. 4, the reference frequency is equal to the required sampling frequency multiplied by the number of channels. Thus, as the number of channels changes, the reference frequency is scaled accordingly.

Figure 9:
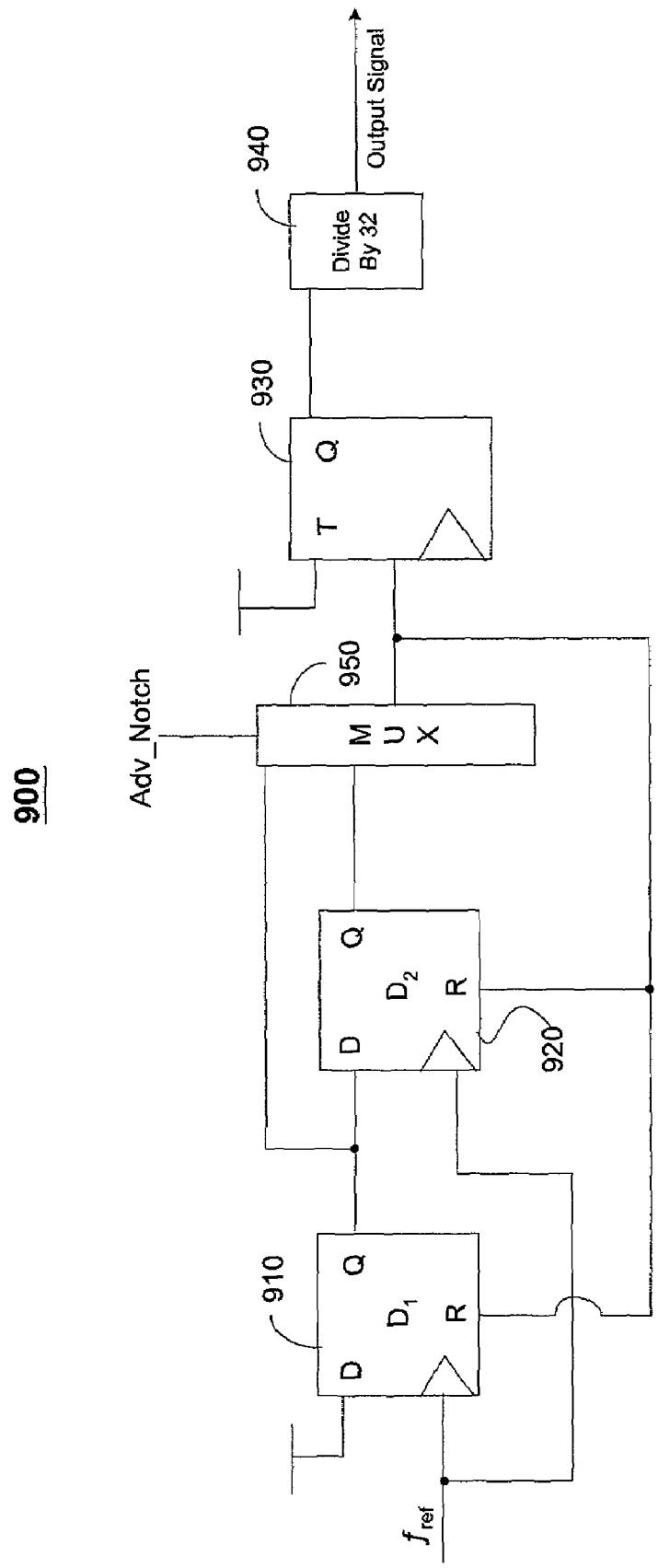
FIG. 9 is a high-level circuit diagram of another system for generating and shifting a sampling signal.

As stated above, only one flip-flop needs to be skipped in order to provide a phase-shifting mechanism. Accordingly, a variety of alternate implementations are possible that use only one, or more, flip-flops. One such implementation is shown in FIG. 9, which illustrates a system 900 that may use two D flip-flops 910, 920 and one T flip-flop 930. The implementation of FIG. 9 may also divide the incoming reference frequency by 128, as does the implementation of FIG. 4. Frequency division is achieved by propagating a one through the two flip-flops 910, 920 and the T flip-flop 930. The reset input on the two flip-flops 910, 920 is presumed to be unclocked. That part of the operation is analogous to the previous discussion of FIG. 4, and the signal coming from the output of the T flip-flop 930 has a frequency four times slower than that of the incoming signal $f_{ref}$. The output of the T flip-flop 930 may then be passed through a divide-by-thirty-two element 940 to produce an output signal with a frequency 128 times slower than that of the input signal $f_{ref}$. The divide-by-thirty-two element 940 may be implemented using one of the previously discussed techniques or using other suitable methods.

The system 900 may also include a mux 950 that is used to selectively bypass the flip-flop 920 when phase-shifting is desired. As illustrated in FIG. 9, the output of the mux 950, which represents the flip-flop bypassing logic, may be sent directly to the T flip-flop 930. FIG. 4, in contrast, shows the output of the flip-flop bypassing logic 450, 460, 470 feeding flip-flop 420.63. Yet other implementations, in addition to the two shown in FIGS. 4 and 9, will be apparent to those of ordinary skill.

Some of the implementations discussed are suited to multi-channel communication. In particular, a digital 0.18 micrometer CMOS integrated circuit implementation has been designed for channels operating at 50 megabits/second or faster. The design is all-digital, hard-wired, portable, and suited for use with channel data rates in the multigigabit/second range. Various implementations are also scaleable to different phase-step requirements, so as to provide a phase-step as small as the period of the fastest clock that the technology can sustain. Implementations may also incorporate controls to make the phase-step dynamically configurable. Implementations may also provide a fully hard-wired solution for multi-channel communications which can be highly parallel to enable data rates reaching the capability of a given integrated circuit technology. As indicated earlier, allowing faster data rates in a channel allows a design having fewer channels, or it can provide a higher total data rate. Such a design will be smaller, less expensive, easier to design, and more robust.

Various modifications may be made to the implementations in the disclosure. For example, alternate methods of dividing a frequency, delaying a clock, and bypassing circuit elements are widely known. Additionally, the phase shift can be accomplished by including circuit elements for a predetermined amount of time rather than bypassing circuit elements. Further, the techniques and systems described can be applied to the generation of signals such as, for example, clocks, for a variety of applications including, but not limited to, generating sampling signals in multi-channel communication systems. Examples of specific applications include, for example, wireless communication, an example of which is shown in FIG. 1, wired communication, and phase-synchronizing signals.

Figure 10:
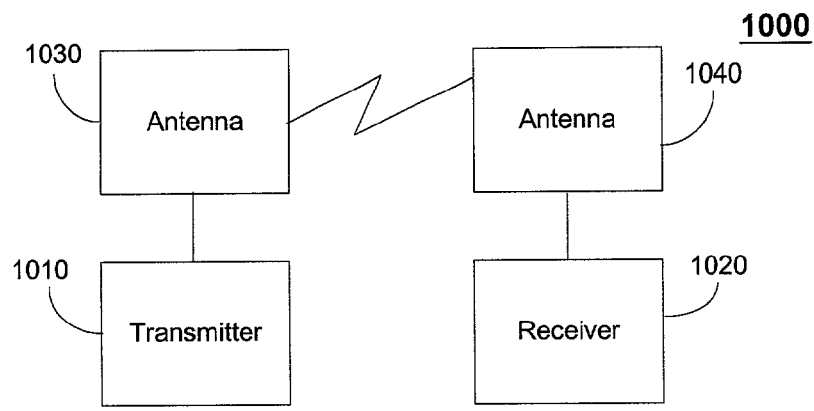
FIG. 10 is a block diagram of a wireless system.

Referring to FIG. 10, there is shown another wireless implementation 1000 in which a transmitter 1010 communicates with a receiver 1020 using antennas 1030 and 1040. If multiple channels are used, the data may be multiplexed using, for example, code division multiple access ("CDMA") or time division multiple access ("TDMA").

Figure 11:
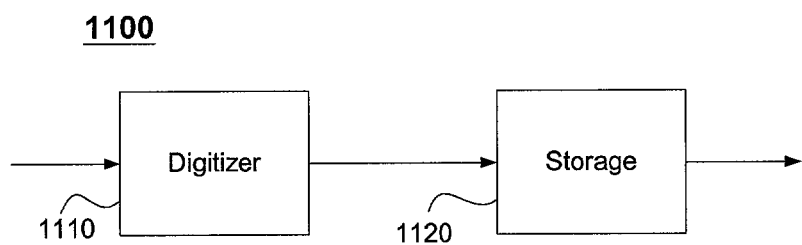
FIG. 11 is a block diagram of a system for digitizing and storing data.

Referring to FIG. 11, a further example of wireless communication is shown. A system 1100 may include a digitizer 1110 and a storage 1120. One application of the system 1100 follows. A received signal may be down-converted and the modulated signal may be sampled in the digitizer 1110 at a rate in excess of the data rate. This digitization may be done before the data is synchronized with a sampling signal. The digital samples may be stored at least temporarily in the storage 1120 which may be, for example, a digital storage medium such as a hard disk or a random access memory. The stored digital samples may later be retrieved and sampled at the data rate to recover the data.

Another specific application includes wired communication. Transmission media for wired communication may include, for example, wire, cable, and fiber optic cable.

Figure 12:
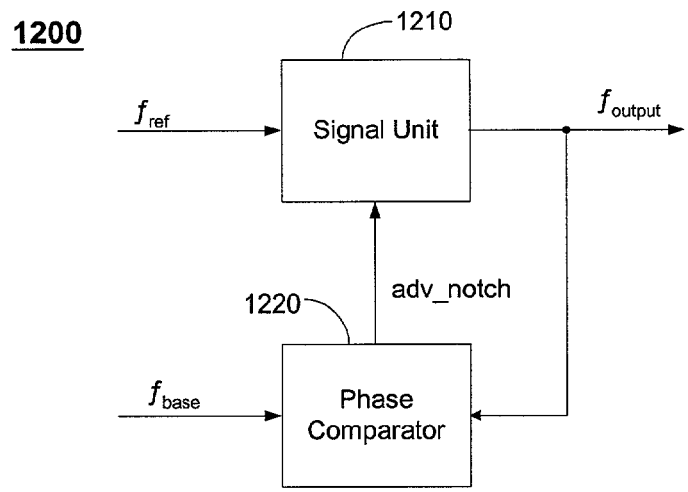
FIG. 12 is a block diagram of a system for phase synchronization.

A further specific application includes phase synchronizing clocks or other signals, for example, within a motherboard or from disparate sources. Referring to FIG. 12, a phase-locked loop 1200 may include a signal unit 1210 and a phase comparator 1220. The signal unit 1210 may be analogous, for example, to one of the signal units 140, 300, or 400 in FIG. 1, 3, or 4. The signal unit 1210 divides $f_{ref}$ to produce $f_{output}$ and phase shifts $f_{output}$ as directed by the phase comparator 1220. The phase comparator 1220 may perform phase comparison to produce an adv_notch signal (analogous to the advance notch signal 346) indicating whether the phase of $f_{output}$ is to be shifted. The signal $f_{base}$ may be used as the standard to which $f_{output}$ is being phase synchronized. The signal $f_{base}$ may originate from a variety of sources. For example, $f_{base}$ may come from a motherboard, a crystal, or be received over a wireless communication path.

A number of implementations have been described. Nevertheless, it will be understood that various modifications may be made. Accordingly, other implementations are within the scope of the following claims.

What is claimed is:

1. A method of shifting the phase of a signal, the method comprising:
    dividing a frequency of a first signal by a selected number to produce a second signal having a lower frequency;
    shifting the phase of the second signal multiple times by changing, for at least a predetermined amount of time, the selected number by which the first signal frequency is divided, and subsequently restoring the selected number to its original value;
    using the second signal as a sampling signal, sampling data in a channel of a multi-channel communication system after the multiple phase shifts;
    determining a measure of quality for the sampled data for different values of phase shift; and
    determining an optimum phase shift for the second signal.

2. The method of claim 1 further comprising receiving the first signal.

3. The method of claim 1 wherein the first signal comprises an input clock signal and the second signal comprises an output clock signal.

4. The method of claim 1 further comprising performing the dividing and shifting in complementary metal oxide semiconductor circuitry.

5. The method of claim 1 wherein changing the selected number comprises lowering the selected number.

6. The method of claim 1 wherein:
    dividing comprises using a hardware-implemented frequency divider comprising at least two flip-flops coupled together in a chain operating at the first signal frequency,
    shifting comprises using a hardware-implemented digital phase shifter, and
    changing the selected number comprises bypassing a flip-flop.

7. The method of claim 1 wherein the first signal frequency is at least 1 GHz.

8. The method of claim 1 wherein the shifting comprises shifting in a phase increment as small as one period of the first signal.

9. The method of claim 1 wherein the shifting comprises shifting in a phase increment that is dynamically configurable.

10. A method of shifting the phase of a signal, the method comprising:
    using two or more coupled flip-flops to frequency divide a first signal, with the flip-flops being clocked by the first signal and the dividing result in a second signal; and
    shifting the phase of the second signal by using logic gates to selectively bypass at least one of the flip-flops for at least a predetermined amount of time.

11. The method of claim 10 further comprising using the second signal as a sampling clock.

12. The method of claim 10 wherein the shifting comprises shifting by a single period of the first signal.

13. A communications system comprising:
    a frequency divider comprising multiple flip-flops or latches coupled together in series and capable of dividing a frequency of a first signal by a selected number to produce a second signal having a lower frequency;
    a phase shifter comprising logic for selectively bypassing a flip-flop or a latch in the series and thereby shifting the phase of the second signal by changing, for at least a predetermined amount of time, the selected number by which the first signal frequency is divided, and subsequently restoring the selected number to its original value;
    an antenna capable of receiving a data signal transmitted over a wireless communication path using code division multiple access ("CDMA") to multiplex multiple channels;
    a down-converter capable of down-converting the data signal received over a wireless communication path using CDMA; and
    a sampler capable of sampling the down-converted data signal using the second signal as a clock signal.

14. The communications system of claim 13 wherein:
    the frequency divider comprises multiple flip-flops coupled together in series operating at the first signal frequency, and
    the phase shifter comprises hardware for selectively bypassing a flip-flop.

15. The communications system of claim 14 wherein:
    the first signal frequency is at least 1 GHz, and
    the multiple flip-flops operate at clock frequencies of at least 1 GHz.

16. The communications system of claim 13 further comprising a data analyzer capable of determining a measure of quality for the sampled data for different values of phase shift and determining an optimum phase shift for the second signal.

17. The communications system of claim 13 wherein the frequency divider and the phase shifter are implemented together on a single integrated circuit.

18. The communications system of claim 13 wherein the phase shifter is capable of shifting the phase of the second signal in a phase increment as small as one period of the first signal.

19. The communications system of claim 13 wherein a size of the phase shift is dynamically configurable.

20. The communications system of claim 13 further comprising:
    a second frequency divider; and
    a second phase shifter,
    wherein the frequency divider and the phase shifter operate in a first channel of a multi-channel communication system, and the second frequency divider and the second phase shifter operate in a second channel of the multi-channel communication system.

21. A method of frequency division, the method comprising:
    dividing a frequency of a signal using a circuit including flip-flops or latches of a given transistor technology coupled in series with a direct connection between an output of each flip-flop or latch and an input of a next flip-flop or latch in the series, the circuit being capable of operating at a frequency substantially equal to the highest possible frequency for the given transistor technology; and selectively and temporarily bypassing at least some of the flip-flops or latches in the series to shift a phase of an output signal.

22. The method of claim 21 wherein the circuit includes flip flops connected in series.

23. The method of claim 21 wherein the frequency is at least 1 gigabit/second.

24. A method of shifting the phase of a signal, the method comprising:

dividing a frequency of a first signal by a selected number to produce a second signal having a lower frequency using a hardware-implemented frequency divider comprising at least two flip-flops coupled together in a chain operating at the first signal frequency; and shifting the phase of the second signal using a hardware-implemented digital phase shifter by changing, for at least a predetermined amount of time, the selected number by which the first signal frequency is divided by bypassing a flip-flop, and subsequently restoring the selected number to its original value.

25. The method of claim 24 wherein the first signal comprises an input clock signal and the second signal comprises an output clock signal.

26. The method of claim 24 wherein the hardware-implemented frequency divider and the hardware-implemented digital phase shifter comprise complementary metal oxide semiconductor circuitry.

27. The method of claim 24 wherein the shifting comprises shifting in a phase increment that is dynamically configurable.

* * * * *